United States Patent
Tarkiainen et al.

(10) Patent No.: US 6,972,976 B2
(45) Date of Patent: Dec. 6, 2005

(54) COMPENSATION METHOD FOR A VOLTAGE UNBALANCE

(75) Inventors: Antti Tarkiainen, Lappeenranta (FI); Mikko Vertanen, Espoo (FI)

(73) Assignee: ABB Oy, Helsinki (FI)

( * ) Notice: Subject to any disclaimer, the term of this patent is extended or adjusted under 35 U.S.C. 154(b) by 0 days.

(21) Appl. No.: 10/512,579

(22) PCT Filed: Mar. 11, 2004

(86) PCT No.: PCT/FI2004/000142

§ 371 (c)(1),
(2), (4) Date: Oct. 26, 2004

(87) PCT Pub. No.: WO2004/082096

PCT Pub. Date: Sep. 23, 2004

(65) Prior Publication Data

US 2005/0201130 A1    Sep. 15, 2005

(30) Foreign Application Priority Data

Mar. 14, 2003  (FI)  .................................. 20030385

(51) Int. Cl.$^7$ ............................................. H02M 5/00
(52) U.S. Cl. ........................... 363/164; 363/9; 363/47; 363/165
(58) Field of Search ............................ 363/8, 9, 10, 40, 363/43, 44, 47, 125, 132, 164, 165, 173, 363/174

(56) References Cited

U.S. PATENT DOCUMENTS

| | | | | |
|---|---|---|---|---|
| 5,148,361 | A |   | 9/1992 | Braun et al. ................... 363/95 |
| 6,031,738 | A | * | 2/2000 | Lipo et al. ..................... 363/43 |
| 6,094,364 | A |   | 7/2000 | Heikkila ....................... 363/41 |
| 6,154,378 | A | * | 11/2000 | Peterson et al. ............. 363/132 |
| 6,163,472 | A | * | 12/2000 | Colby ........................... 363/44 |

FOREIGN PATENT DOCUMENTS

| | | |
|---|---|---|
| DE | 40 14 077 | 12/1992 |
| WO | WO 99/44276 | 9/1999 |
| WO | WO 02/075915 | 9/2002 |

* cited by examiner

*Primary Examiner*—Jessica Han
(74) *Attorney, Agent, or Firm*—Dykema Gossett PLLC

(57) ABSTRACT

The invention relates to a method for compensating for a voltage unbalance in an electrical network, which is fed by using an apparatus based on controlling a flux linkage vector or a voltage vector. Concerning the apparatus based on controlling the flux linkage vector, the method comprises the steps of determining a flux linkage reference vector comprising a positive sequence component and a negative sequence component, and controlling the feeding apparatus of the network in such a manner that the flux linkage vector thereof follows the reference vector with predetermined precision. The negative sequence component of the flux linkage reference vector is arranged to compensate for the amplitude and phase unbalance of the voltage in the electrical network to be fed.

11 Claims, 2 Drawing Sheets

COMPENSATION METHOD FOR A VOLTAGE UNBALANCE

BACKGROUND OF THE INVENTION

The invention relates to compensating for a voltage unbalance, and particularly to compensating for an amplitude and phase unbalance of an isolated network fed via a frequency converter.

The voltage unbalance deteriorates the quality of electricity, and it may be detrimental to some devices connected to an electrical network. In three-phase current motors, for instance, a voltage unbalance may cause additional heating.

An isolated network fed via a frequency converter is, due to the supply filter, inevitably a weak network. As a result, unbalanced loads cause voltage unbalance. It has been detected in practical measurements that when two phases are loaded with nominal loads while a third phase is without current, the voltage unbalance generated may be in the order of 10%, the allowed limit value in electrical networks being typically 2%.

Controlling the converter feeding an electrical network can typically be implemented in such a way that a flux linkage vector of the converter estimated with the voltage integral $$\psi_1 = \int \underline{u}_1 dt$$

is forced to follow a reference vector $\psi_{ref}$ formed computationally.

In feeding an electrical network, it is known to use DTC (Direct Torque Control) type scalar modulation based on controlling a flux linkage vector. A problem has been, however, that so far there has not been a usable method for a DTC-type converter based on controlling flux linkage to compensate for a voltage unbalance.

BRIEF DESCRIPTION OF THE INVENTION

An object of the invention is to provide a method suitable for a converter based on controlling flux linkage to compensate for a voltage unbalance in such a way that the above-mentioned problem can be solved. The object of the invention is achieved with a method characterized by what is stated in the independent claim. Preferred embodiments of the invention are described in the dependent claims.

The invention is based on the idea that for a reference vector of a feeding apparatus of an electrical network based on controlling flux linkage, which vector the output of the feeding apparatus of the electrical network is arranged to follow, such a value is defined that when the value is used for controlling the feeding apparatus of the network, the amplitude and phase unbalance of the electrical network can be compensated for within predetermined limits.

An advantage of the compensation method for a voltage unbalance according to the invention is that the apparatus based on controlling a flux linkage vector can be used for compensating for a voltage unbalance. Further, an advantage of the method according to the invention is its adaptability, i.e. its capability to adapt to changing conditions.

The adaptive correction method for a voltage unbalance according to the invention allows the use of isolated operation applying DTC scalar modulation also with unbalanced loads.

BRIEF DESCRIPTION OF THE FIGURES

The invention will now be described in greater detail in connection with preferred embodiments, with reference to the attached drawings, of which.

DETAILED DESCRIPTION OF THE INVENTION

A three-phase unbalanced network can be presented with the aid of three symmetrical three-phase components, i.e. the zero sequence system (ZSS), the positive sequence system (PSS) and the negative sequence system (NSS).

Figure 1:
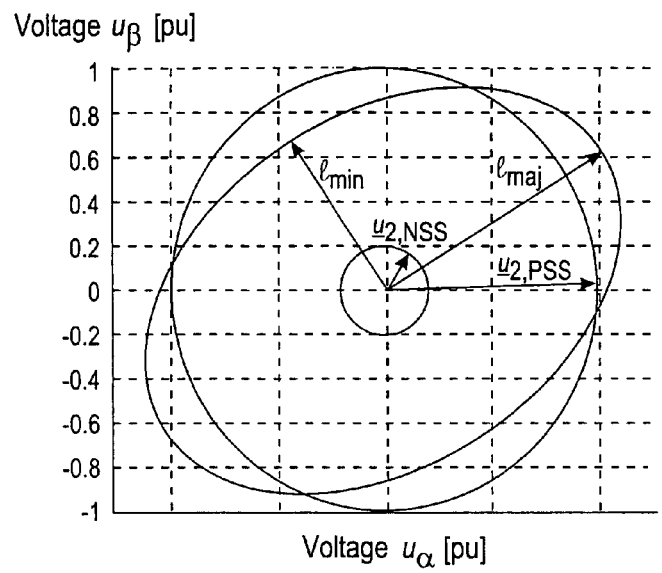
FIG. 1 shows circular graphs drawn by the tips of space vectors of the positive sequence and negative sequence systems, and an elliptical graph drawn by the tip of a sum vector.

If no zero sequence component occurs in the electrical network, the total voltage is the sum of the negative sequence and the positive sequence components, in which case the graph of the voltage vector $\underline{u}_2$ in the network is an ellipse in accordance with FIG. 1, and the voltage vector in question can be determined with the following equation:

$$\underline{u}_2 = u_{2,PSS} e^{j\omega t} + u_{2,NSS} e^{-j(\omega t - \phi)},$$

where $u_{2,PSS}$ is the magnitude of the positive sequence component of the voltage in the electrical network, $u_{2,NSS}$ is the magnitude of the negative sequence component of the voltage in the electrical network, $\omega$ is the angular frequency, t is time, and $\phi$ is the phase-angle difference between the positive sequence and negative sequence systems at starting time. At the major semi-axis of the ellipse the angles of the positive and negative sequence system vectors are the same, so that the angle of the major semi-axis is $$\alpha_{maj} = \phi/2 + n\pi.$$

The length $I_{maj}$ of the major semi-axis of the ellipse is the sum of the length $u_{2,PSS}$ of the positive sequence vector and the length $u_{2,NSS}$ of the negative sequence vector of the voltage. The minor semi-axis of the ellipse is perpendicular relative to the major semi-axis, so that its angle is $$\alpha_{min} = \phi/2 - \pi/2 + n\pi.$$

The length $I_{min}$ of the minor semi-axis is the difference between the length $u_{2,PSS}$ of the positive sequence vector and the length $U_{2,NSS}$ of the negative sequence vector of the voltage. The length $U_{2,PSS}$ of the positive sequence vector of the voltage is received by dividing the sum of the length $I_{maj}$ of the major semi-axis and the length $I_{min}$ of the minor semi-axis by two.

$$u_{2,PSS} = \frac{l_{maj} + l_{min}}{2}$$

Correspondingly, the length $U_{2,NSS}$ of the negative sequence vector of the voltage is received by dividing the difference between the length $I_{maj}$ of the major semi-axis and the length $I_{min}$ of the minor semi-axis by two.

$$u_{2,NSS} = \frac{l_{maj} - l_{min}}{2}$$

On the basis of the above, the magnitudes of the positive sequence and negative sequence system components can be deduced from the lengths of the semi-axes of the ellipse. As noted above, the phase-angle difference between the positive sequence and negative sequence systems at starting time can be deduced from the angle of the major semi-axis of the ellipse. Thus, determining the negative sequence network can be returned to determining the properties of the sum voltage ellipse.

Figure 2:
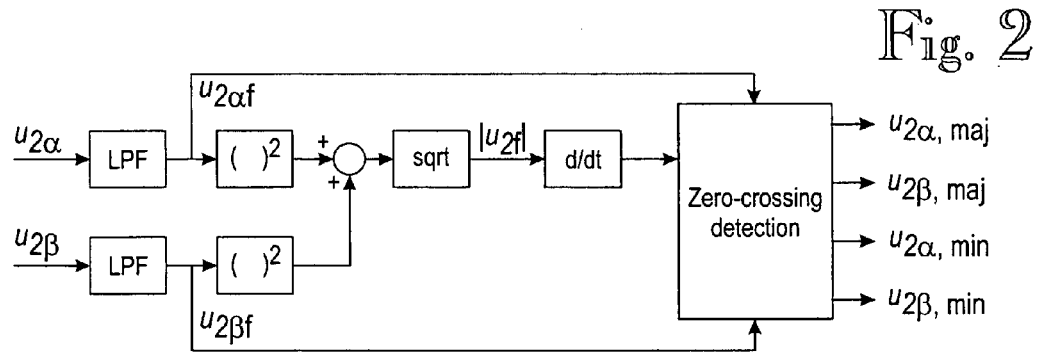
FIG. 2 shows a block diagram for determining the components of the semi-axes of an ellipse formed by a voltage space vector in an electrical network.

FIG. 2 shows one way to determine components $u_{2\alpha,maj}$, $u_{2\beta,maj}$, $u_{2\alpha,min}$ and $u_{2\beta,min}$ of the major and minor semi-axes of the ellipse formed by the voltage space vector in the electrical network. The voltage vector components $u_{2\alpha}$ and $u_{2\beta}$ of the electrical network that have been measured first are low-pass-filtered in such a way that only a fundamental wave remains. The purpose of the low-pass filtering is to remove the harmonic components. The filter type is not restricted in any way, and the phase errors caused by the filters do not affect the functioning of the method.

In practice, there is no need to filter out the harmonic waves of the voltage vector components $u_{2\alpha}$ and $u_{2\beta}$ quite completely, but it suffices to reduce their number to a predetermined level. Thus, in some cases low-pass filtering may not be needed at all.

In the procedure shown in FIG. 2, the axes of the ellipse are determined by recognizing the extreme value points of the length $|\underline{u}_{2f}|$ of the fundamental wave voltage vector. The extreme value points are determined with a simple derivative test, which can be presented as a discreet algorithm below, where k is the time index and $T_S$ is the sampling period.

1. Compute the length $|\underline{u}_{2f}|$ of the fundamental wave vector of the voltage.
2. Approximate the derivative with difference $d_k = (|\underline{u}_{2f}|_k - |\underline{u}_{2f}|_{k-1})/T_S$.
3. Check the extreme value conditions.
   If $d_k < 0$ and $d_{k-1} > 0$, a maximum (major semi-axis) is concerned.
   If $d_k > 0$ and $d_{k-1} < 0$, a minimum (minor semi-axis) is concerned.
4. If a maximum or minimum was found, store the current $u_{2\alpha f,k}$ and $u_{2\beta f,k}$, depending on the type of the extreme value, as components of vector $\underline{u}_{2,maj}$ or $\underline{u}_{2,min}$.

The classification of the extreme values on the basis of the zeros of the derivative signal, taking place at point 3 in the algorithm, is analogous with the classification of extreme values of continuous functions based on the sign of the second derivative. In the practical implementation at point 1, the quadratic length of the fundamental wave vector can be used, because the square root as a monotonic function does not affect the extreme values. Further, at point 2 the difference quotient can be replaced with the difference by omitting the division by the sampling period $T_s$.

When the above-described algorithm is used, the sampling period $T_S$ may be 100 μs, for example. At point 4 of the algorithm, the number of values $u_{2\alpha f,k}$ and $u_{2\beta f,k}$ to be stored can, if desired, be halved by storing only the semi-axis components that are located at the left half-plane, for example.

Determination of the components of the semi-axes of the ellipse is the only time-critical stage in measuring the negative sequence system. The other stages may be implemented at slower time planes, for instance at a time plane of 1 ms. The lengths $I_{maj}$ and $I_{min}$ of the semi-axes of the voltage ellipse are computed by means of determined components with the following equations:

$$l_{maj} = \sqrt{u_{2\alpha,maj}^2 + u_{2\beta,maj}^2} \text{ and}$$
$$l_{min} = \sqrt{u_{2\alpha,min}^2 + u_{2\beta,min}^2}.$$

The magnitudes $u_{2,PSS}$ and $u_{2,NSS}$ of the positive sequence and negative sequence components can be computed by means of the lengths $I_{maj}$ and $I_{min}$ of the semi-axes of the ellipse with the above-described equation. The following equation yields the angle $\alpha_{min}$ of the minor semi-axis of the ellipse:

$$\alpha_{min} = \arctan\left(\frac{u_{2\beta,min}}{u_{2\alpha,min}}\right).$$

Figure 3:
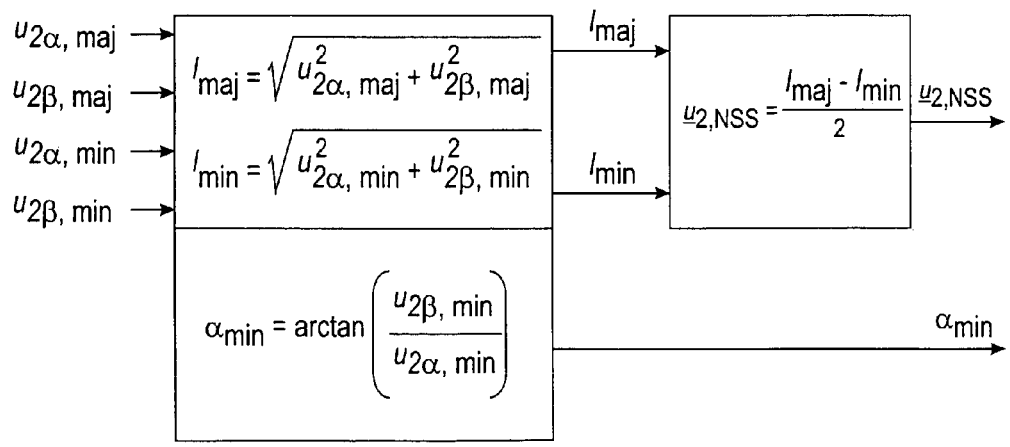
FIG. 3 shows a block diagram for determining the magnitude of the negative sequence component of the voltage in an electrical network and the angle of the minor semi-axis of the voltage ellipse.

One way to determine the length $u_{2,NSS}$ of the negative sequence vector of the voltage in the electrical network and the angle $\alpha_{min}$ of the minor semi-axis of the voltage ellipse is shown in FIG. 3. The output information of the block diagram of FIG. 2, i.e. the components of the major and minor semi-axes of the ellipse formed by the voltage space vector in the electrical network, is fed to the input of the block diagram of FIG. 3.

As noted above, the scalar control of the frequency converter can be implemented in such a way that the estimated flux linkage vector $\psi_1$, is forced to follow the reference vector $\psi_{ref}$ formed computationally. When such control is used, the voltage unbalance of the network to be fed can be compensated for by producing with a converter a negative sequence component which is in the opposite phase and which cancels the negative sequence component in the network. The negative sequence component of the voltage compensating for the voltage unbalance can be provided adding an appropriate negative sequence component to the flux linkage vector reference, whereby the flux linkage vector reference $\psi_{ref}$ is defined with the following equation:

$$\psi_{ref} = \psi_{ref,PSS} + \psi_{ref,NSS},$$

where the positive sequence component $\psi_{ref,PSS}$ of the flux linkage reference corresponds to a conventional flux linkage reference of scalar control, the determination of which is known, $\psi_{ref,NSS}$ being the negative sequence component of the flux linkage reference, compensating for the voltage unbalance.

The negative sequence component $\psi_{ref,NSS}$ of the flux linkage reference can be computed by complex-conjugating the positive sequence component $\psi_{ref,PSS}$ and by multiplying the result by a complex scaling factor $\underline{k}$, which comprises a real part $k_\alpha$ and an imaginary part $k_\beta$.

$$\psi_{ref,NSS} = \underline{k}\psi_{ref,PSS}$$

With complex-conjugation, the direction of rotation of the negative sequence component can be made opposite to that of the positive sequence component. With complex factor k, the length of the negative sequence component is scaled in relation to the positive sequence component, and the phase angle of the negative sequence component is determined in relation to the positive sequence component.

In the case of a fundamental wave, the axes of the ellipses of the voltage vector and of the flux linkage vector formed of it by integrating are parallel. This is because the phase shifts caused by the integration are equal in both vector components, whereby it does not cause a change in the graph of the vector tip, but only a temporal delay. For the same reason, phase shifts of different filtering measures do not affect the position of the axes of the ellipse if the measures are directed in the same way at both vector components.

In order to cancel the voltage unbalance of the electrical network fed by the converter, the voltage of the converter must be made unbalanced in such a way that the major semi-axis of its voltage ellipse is parallel to the minor semi-axis of the voltage ellipse of the network to be fed.

The angle of the major semi-axis of the voltage ellipse is determined by the initial angle difference $\phi$ between the positive and negative sequence components, which can be determined by the following equation:

$$\phi = 2\alpha_{maj} - n2\pi,$$

and which is set with scaling factor k. The angle (argument) of scaling factor k must thus be selected to be twice as great as the angle of the minor semi-axis of the electrical network, whereby the minor semi-axis of the voltage ellipse of the electrical network and the major semi-axis of the voltage ellipse of the converter can be made parallel. The modulus of the scaling factor is scaled by the magnitude $u_{2,NSS}$ of the negative sequence component of the network to be fed. The following equation thus yields the real part $k_\alpha$ and the imaginary part $k_\beta$ of factor k:

$$k_\alpha = U_{2,NSS} \cos(2\alpha_{min}) \text{ and}$$

$$k_\beta = U_{2,NSS} \sin(2\alpha_{min}).$$

In a control system in practice, the computed $k_\alpha$ and $k_\beta$ should usually be intensely low-pass-filtered. In order to eliminate the system deviation of the steady state, a control algorithm containing an integrating part should be used for the components of scaling factor k before the negative sequence component $\psi_{ref,NSS}$ of the flux linkage vector is computed. It is to be noted, however, that owing to the intense low-pass filtering, using merely a P controller provides a very small error in the steady state, because then it is possible to use rather great controller amplification. In a practical implementation, for example value 1 s can be used as the time constant in low-pass filtering.

Figure 4:
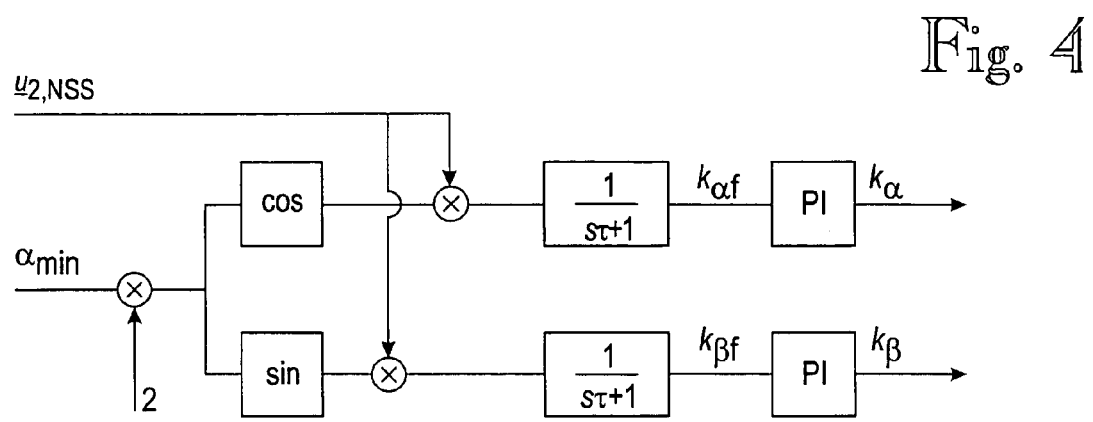
FIG. 4 shows a block diagram for computing a complex scaling factor.

FIG. 4 shows, in the form of a block diagram, an example of determining the components of scaling factor k. The output information of the block diagram of FIG. 3, i.e. the length $u_{2,NSS}$ of the negative sequence sector of the voltage in the electrical network and the angle $\alpha_{min}$ of the minor semi-axis of the voltage ellipse, is fed to the input of the block diagram of FIG. 4.

Above, the ellipse formed by a voltage space vector in an electrical network is assumed to be of a shape of a complete ellipse, known from the theory of mathematics. In practice, the ellipse formed by a voltage space vector in an electrical network is always somewhat deformed, but it is obvious that this does not in any way prevent the use of the method according to the invention, because with an appropriate algorithm, the location of the semi-axes can be determined even from an incomplete ellipse. There are several known algorithms applicable to the determination of the semi-axes of incomplete ellipses, and the method according to the invention does not impose restrictions on the algorithm to be used.

Above, the method according to the invention is used in a case where there is no zero sequence component in the electrical network. Although the presented method is based on measuring a voltage space vector where a zero sequence component is not seen in any way, it is clear that the method according to the invention can be used for compensating for also such voltage unbalance in electrical networks where the zero sequence component occurs.

The method for forming the negative sequence system of a flux linkage vector according to the invention can also be used with unbalance identification methods other than the one described above.

It has been noted above that the method according to the invention is applicable to feeding apparatus whose operation is based on controlling a flux linkage vector. Since the flux linkage and voltage of the feeding apparatus are quantities dependent on each other, i.e. controlling the flux linkage affects the voltage and vice versa, it will be obvious to a person skilled in the art that the method according to the invention can also be used with apparatus whose operation is based on controlling their voltage.

It will be obvious to a person skilled in the art that the basic idea of the invention can be implemented in a plurality of ways. Thus, the invention and its embodiments are not restricted to the above examples but may vary within the scope of the claims.

What is claimed is:

1. A method for compensating for a voltage unbalance in an electrical network, which is fed by using an apparatus based on controlling a space vector quantity, whereby said space vector quantity is voltage or a space vector quantity dependent on it, the method comprising the steps of
   determining a reference vector of the space vector quantity comprising a positive sequence component; and
   controlling the feeding apparatus of the network in such a manner that the space vector quantity thereof follows the reference vector with predetermined precision,
   wherein the reference vector of the space vector quantity further comprises a negative sequence component arranged to compensate for the amplitude and phase unbalance of the voltage in the electrical network to be fed.

2. A method according to claim 1, wherein said space vector quantity being is flux linkage.

3. A method according to claim 2, wherein the negative sequence component of the reference vector is determined by multiplying the complex conjugate of the positive sequence component of the reference vector by a complex scaling factor (k), with which the length of the negative sequence component can be scaled in relation to the positive sequence component and with which the phase angle of the negative sequence component can be determined in relation to the positive sequence component.

4. A method according to claim 3, wherein the determination of the complex scaling factor comprises the steps of
   determining the length of the negative sequence component vector of the voltage in the electrical network;
   determining the angle of the minor semi-axis of the ellipse formed by the space vector of the voltage in the electrical network,
   whereby determining the real part of the complex scaling factor comprises the steps of multiplying the angle of the minor semi-axis of the ellipse formed by the space vector of the voltage in the electrical network by two;

calculating cosine of said double angle and multiplying the result by the length of the negative sequence component vector of the voltage in the electrical network whereby determining the imaginary part of the complex scaling factor comprising the steps of multiplying the angle of the minor semi-axis of the ellipse formed by the space vector of the voltage in the electrical network by two;

calculating sine of said double angle and multiplying the results of the length of the negative sequence component vector of the voltage in the electrical network.

5. A method according to claim 4, wherein a flux linkage reference vector of some conventional scalar control method is used as the value of the positive sequence component of the flux linkage reference vector.

6. A method according to claim 4, wherein the method comprises the steps of low-pass-filtering the real and imaginary parts and of the complex scaling factor and treating them with a PI controller algorithm.

7. A method according to claim 3, wherein the method comprises the steps of low-pass-filtering the real and imaginary parts and of the complex scaling factor and treating them with a PI controller algorithm.

8. A method according to claim 3, wherein a flux linkage reference vector of some conventional scalar control method is used as the value of the positive sequence component of the flux linkage reference vector.

9. A method according to claim 2, wherein a flux linkage reference vector of some conventional scalar control method is used as the value of the positive sequence component of the flux linkage reference vector.

10. A method according to claim 9, wherein the method comprises the steps of low-pass-filtering the real and imaginary parts and of the complex scaling factor and treating them with a PI controller algorithm.

11. A method according to claim 1, wherein the electrical network to be fed is an isolated network, i.e. an electrical network not connected to a public distribution network.

* * * * *